United States Patent
Chen et al.

(10) Patent No.: US 7,262,727 B1
(45) Date of Patent: Aug. 28, 2007

(54) DIGITAL-TO-ANALOG DATA CONVERTER AND METHOD FOR CONVERSION THEREOF

(75) Inventors: Ke-Horng Chen, Taipei County (TW); Tzung-Ling Tsai, Taipei County (TW); Ming-Tan Hsu, Miaoli County (TW); I-Cheng Shih, Taoyuan County (TW)

(73) Assignee: Chunghwa Picture Tubes, Ltd., Taipei (TW)

( * ) Notice: Subject to any disclaimer, the term of this patent is extended or adjusted under 35 U.S.C. 154(b) by 0 days.

(21) Appl. No.: 11/309,036

(22) Filed: Jun. 12, 2006

(51) Int. Cl.
*H03M 1/66* (2006.01)
(52) U.S. Cl. ............................ 341/145; 341/144
(58) Field of Classification Search ......... 341/144–172
See application file for complete search history.

(56) References Cited

U.S. PATENT DOCUMENTS

| | | | |
|---|---|---|---|
| 5,831,566 A | 11/1998 | Ginetti | 341/144 |
| 5,999,115 A | 12/1999 | Connell et al. | 341/145 |
| 6,118,399 A * | 9/2000 | Krone | 341/150 |
| 6,154,162 A * | 11/2000 | Watson et al. | 341/150 |
| 6,329,941 B1 * | 12/2001 | Farooqi | 341/145 |
| 6,466,149 B2 * | 10/2002 | Tabler | 341/144 |
| 6,674,380 B1 * | 1/2004 | Essenwanger | 341/138 |
| 6,819,277 B1 * | 11/2004 | Hu et al. | 341/144 |
| 7,061,412 B1 * | 6/2006 | Wang et al. | 341/118 |
| 7,095,356 B1 * | 8/2006 | Pentakota et al. | 341/172 |
| 7,098,831 B2 * | 8/2006 | Confalonieri et al. | 341/145 |
| 2004/0263373 A1 | 12/2004 | Horsky et al. | 341/145 |

OTHER PUBLICATIONS

"A Low-Power Stereo 16-bit CMOS D/A Converter for Digital Audio" by Schouwenaars et al., IEEE J. Solid-State Circuits, vol. 23, No. 6, pp. 1290-1297, Dec. 1988.

* cited by examiner

*Primary Examiner*—Linh Nguyen
(74) *Attorney, Agent, or Firm*—Jianq Chyun IP Office

(57) ABSTRACT

A digital-to-analog data converter for converting a digital input signal to an analog output signal is provided. The digital-to-analog data converter includes a register, a decoder, a converting unit and an output unit. During a first period, the decoder decodes least significant bits, and takes the decoded least significant bits as a first control signal for controlling the converting unit to output a first converting current according to the first control signal. During a second period, the decoder decodes most significant bits, and takes the decoded most significant bits as a second control signal for controlling the converting unit to output a second converting current according to the second control signal. The output unit registers the first converting current during the first period, amplifying the second converting current, and combining the amplified second converting current with the registered first converting current as the analog output signal during the second period.

17 Claims, 5 Drawing Sheets

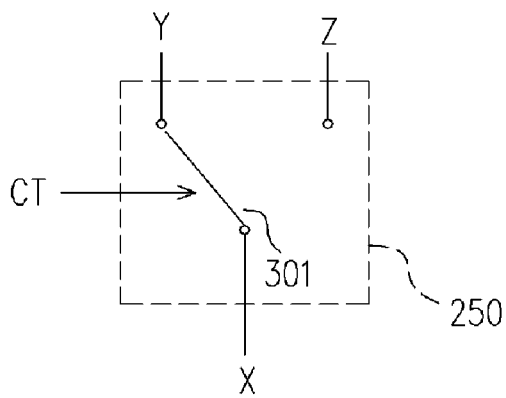
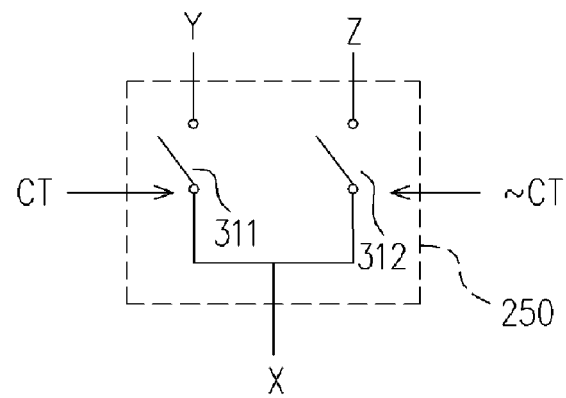
FIG. 3A    FIG. 3B
| binary digital input signal | output of thermometer decoder ||
|---|---|---|
| | control signal CT | control signal ~CT |
| 0  0  0 | 0  0  0  0  0  0  0 | 1  1  1  1  1  1  1 |
| 0  0  1 | 0  0  0  0  0  0  1 | 1  1  1  1  1  1  0 |
| 0  1  0 | 0  0  0  0  0  1  1 | 1  1  1  1  1  0  0 |
| 0  1  1 | 0  0  0  0  1  1  1 | 1  1  1  1  0  0  0 |
| 1  0  0 | 0  0  0  1  1  1  1 | 1  1  1  0  0  0  0 |
| 1  0  1 | 0  0  1  1  1  1  1 | 1  1  0  0  0  0  0 |
| 1  1  0 | 0  1  1  1  1  1  1 | 1  0  0  0  0  0  0 |
| 1  1  1 | 1  1  1  1  1  1  1 | 0  0  0  0  0  0  0 |
FIG. 4

DIGITAL-TO-ANALOG DATA CONVERTER AND METHOD FOR CONVERSION THEREOF

BACKGROUND OF THE INVENTION

1. Field of Invention

The present invention relates to data conversion. More particularly, the present invention relates to a digital-to-analog data converter for converting a digital input signal into an analog output current, suitable for data conversion in the devices such as an organic light emitting diode (OLED).

2. Description of Related Art

A digital-to-analog data converter is widely used in, for example, the driver of an organic light emitting diode (OLED) panel, to convert the pixel data received from a digital control circuit into an analog current signal to drive the panel. Moreover, the driver can also employ another two digital-to-analog data converters such that the user can adjust the contrast and luminance of the panel freely.

Flash digital-to-analog data converter can be classified into three modes including voltage-mode, charge-mode and current-mode. The voltage-mode digital-to-analog data converter utilizes the voltages divided by series of resistors to obtain the required analog output value, while the charge-mode digital-to-analog data converter utilizes a plurality of capacitors of different sizes to obtain the required analog output value. However, the outputs of the above two modes are influenced by the precision of the resistors and the capacitors respectively, and a large area is needed for realizing the capacitors on a chip.

Therefore, the current-mode digital-to-analog data converter, such as the segment current-mode digital-to-analog data converter, is commonly used. In the segment current-mode digital-to-analog data converter, a reference current generator is used to generate a constant current, and map it to a plurality of current sources through a current mirror, for example, if the received digital input signal is of (M+L) bits, $2^{M+L}$ current sources are needed. After that, switches are used to switch these current sources to output the required analog output current.

In more detail, the received digital input signal is first divided into most significant bits having M bits and least significant bits having L bits to be processed respectively. Next, the most significant bits and the least significant bits are decoded by a thermometer decoder respectively, and the decoded signals from the first group of current sources (having $2^M$ current sources) and the second group of current sources (having $2^L$ current sources) are sent to the output node, thereby generating an analog output current corresponding to the digital input signal.

Obviously, the circuit architecture and power consumption of this segment current-mode digital-to-analog data converter will increase along with the bits of the digital input signal increase, and even they will increase in exponential. Therefore, a digital-to-analog data converter having more simple architecture and less power consumption is desired to adapt the increasingly complex circuit architecture.

SUMMARY OF THE INVENTION

The object of the present invention is to provide a digital-to-analog data converter and a method for digital-to-analog data conversion, which are used for converting a digital input signal into an analog output signal, and are suitable for the data conversion in devices such as an OLED.

A digital-to-analog data converter for converting a digital input signal into an analog output signal is provided in the present invention. The digital-to-analog data converter includes a register, a decoder, a converting unit and an output unit. The register is used for receiving and temporarily storing (or registering) the digital input signal, in which the digital input signal includes most significant bits and least significant bits. The decoder is electrically connected to the register for decoding the least significant bits and taking the decoded least significant bits (or the least significant bits that are decoded) as a first control signal during a first period; and decoding the most significant bits and taking the decoded most significant bits (or the most significant bits that are decoded) as a second control signal during a second period. The converting unit is electrically connected to the decoder for outputting a first converting current according the first control signal during the first period, and outputting the second converting current according to the second control signal during the second period. The output unit is electrically connected to the converting unit for registering the first converting current during the first period, amplifying the second converting current and combining the amplified second converting current (or the second converting current that are amplified) and the registered first converting current (or the first converting current that are registered) as an analog output signal during the second period.

A method for digital-to-analog data conversion for converting a digital input signal into an analog output signal is provided in the present invention, which includes receiving a digital input signal having most significant bits and least significant bits. During a first period, the least significant bits are decoded and taken as a first control signal, and then the first control signal is converted to a first converting current. During a second period, the most significant bits are decoded and taken as a second control signal, and then the second control signal is converted to a second converting current and the second converting current is amplified. Finally, the first converting current and the amplified second converting current are combined as an analog output signal.

The digital-to-analog data converter of the present invention employs the same converting unit to carry out digital-to-analog data conversion of the least significant bits and the most significant bits of the digital input signal respectively, therefore the architecture is simple. Moreover, the current needed by the above-mentioned converting unit during the transform of the most significant bits is based on the current needed by the above-mentioned converting unit during the transform of the least significant bits, thus the power consumption of the digital-to-analog data converter is extremely reduced.

In order to the make the above-mentioned and other objects, features and advantages of the present invention apparent, the preferred embodiments in accompany with drawings are described in detail below.

BRIEF DESCRIPTION OF THE DRAWINGS

FIGS. 3A and 3B show the embodiments of the switch of the current supplier in the digital-to-analog data converter of FIG. 2;

FIG. 4 shows the input/output relationship of the thermometer decoder in the digital-to-analog data converter of FIG. 2;

DESCRIPTION OF EMBODIMENTS

Figure 1:
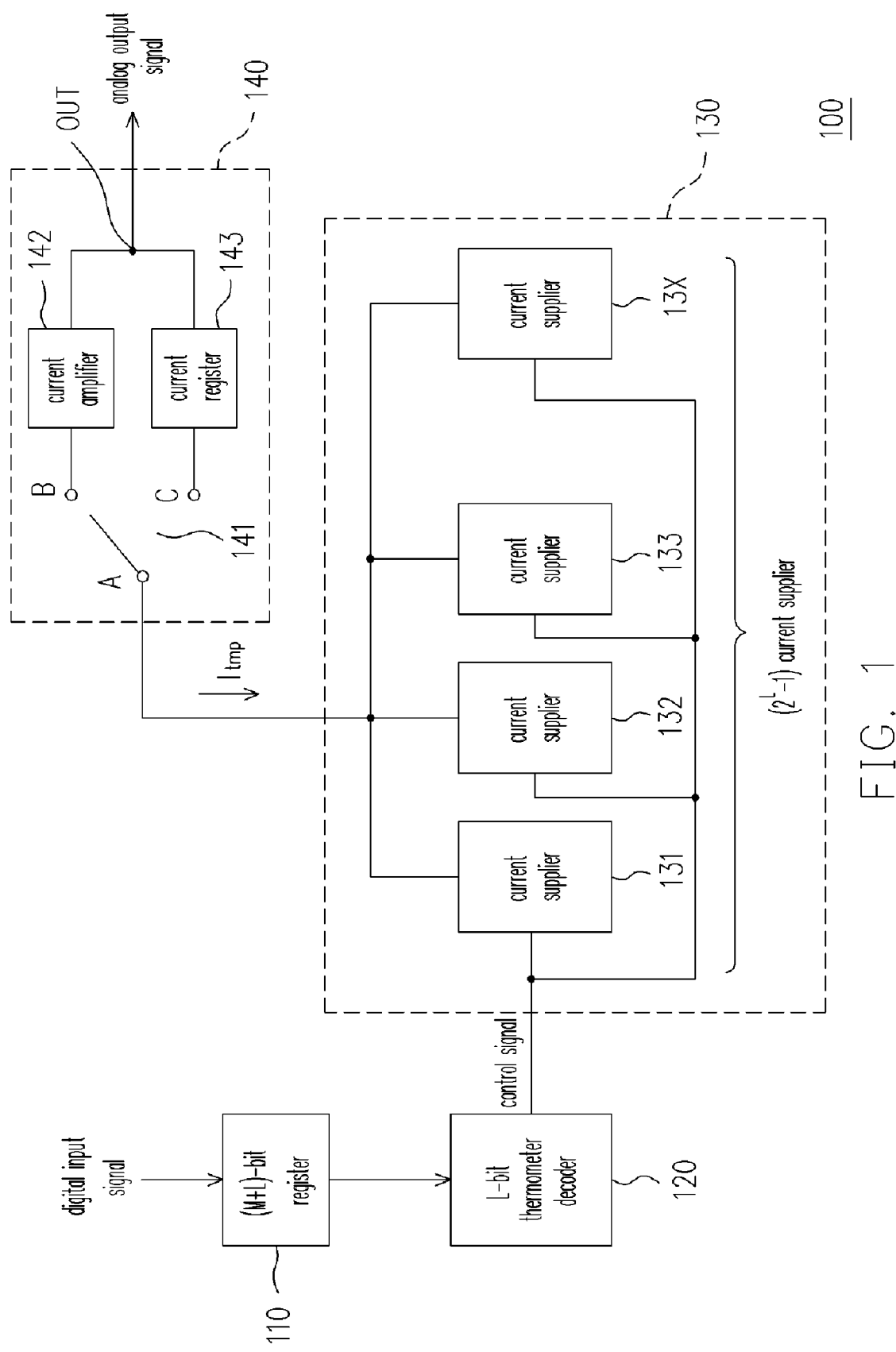
FIG. 1 is a block diagram of a digital-to-analog data converter according to an embodiment of the present invention.

FIG. 1 is a block diagram of a digital-to-analog data converter according to an embodiment of the present invention. Referring to FIG. 1, the digital-to-analog data converter 100 includes a register 110, a thermometer decoder 120, a converting unit 130, an output unit 140 and an output node OUT. In which, the register 110 receives a digital input signal, the thermometer decoder 120 is electrically connected to the register 110, the converting unit 130 is electrically connected to the thermometer decoder 120, and the output unit 140 is electrically connected to the converting unit 130. In addition, the output unit 140 includes an output switch 141, a current amplifier 142 and a current register 143. The output node OUT is electrically connected to the current amplifier 142 and the current register 143, and the output node OUT is used for combining the outputs of the current amplifier 142 and the current register 143 as an analog output signal.

The register 110 is used for receiving and registering the digital input signal, so that the thermometer decoder 120 reads data to be processed. The converting unit 130 includes a plurality of current suppliers 131~13X, and each of the current suppliers determines whether to provide current to the output unit 140 or not according to the received control signal, where $X=2^L-1$. In which, the output currents provided to the output unit 140 from the current suppliers 131~13X can be designed to be substantially the same. This kind of conversion is different from the conventional binary weighted conversion, and is known as the linearly weighted conversion.

According to the conception of the present invention, the digital input signal having (M+L) bits is divided into most significant bits having M bits and least significant bits having L bits for processing respectively, where M and L are positive integers, and M-L. During a first period, the thermometer decoder 120 decodes the least significant bits, and taking the decoded least significant bits as a first control signal for controlling the converting unit 130 to output a first converting current ltmp,1 according to the first control signal. At this time, in the output unit 140, the output switch 141 is switched to a terminal C, i.e. a path is formed between the terminals A and C. Therefore, the first converting current ltmp,1 is conducted to the current register 143 by the output switch 141, and is registered by the current register 143.

During a second period, the thermometer decoder 120 decodes the most significant bits, and taking the decoded most significant bits as a second control signal for controlling the converting unit 130 to output a second converting current ltmp,2 according to the second control signal. At this time, in the output unit 140, the output switch 141 is switched to a terminal B, i.e. a path is formed between the terminals A and B. Therefore, the second converting current ltmp,2 is conducted to the current amplifier 142 by the output switch 141, and is amplified by $2^L$ times by the current amplifier 142. Finally, the first converting current ltmp,1 output by the current register 143 and the second converting current ltmp,2 amplified by $2^L$ times output by the current amplifier 142 are combined at the output node OUT as an analog output signal.

Generally, M is designed to be equal to L if M+L is an even number; and, M is designed to be equal to L−1 if M+L is an odd number, and thus the smallest number of current suppliers can be used to achieve a simple architecture and low power consumption. Moreover, the converting unit for processing the least significant bits is used to process the most significant bits and amplify the analog current signal resulted from converting the most significant bits, that is, a same converting unit is used to carry out digital-to-analog data conversion of the least significant bits and the most significant bits, thereby significantly simplifying the circuit architecture, and reducing the power consumption.

Figure 2:
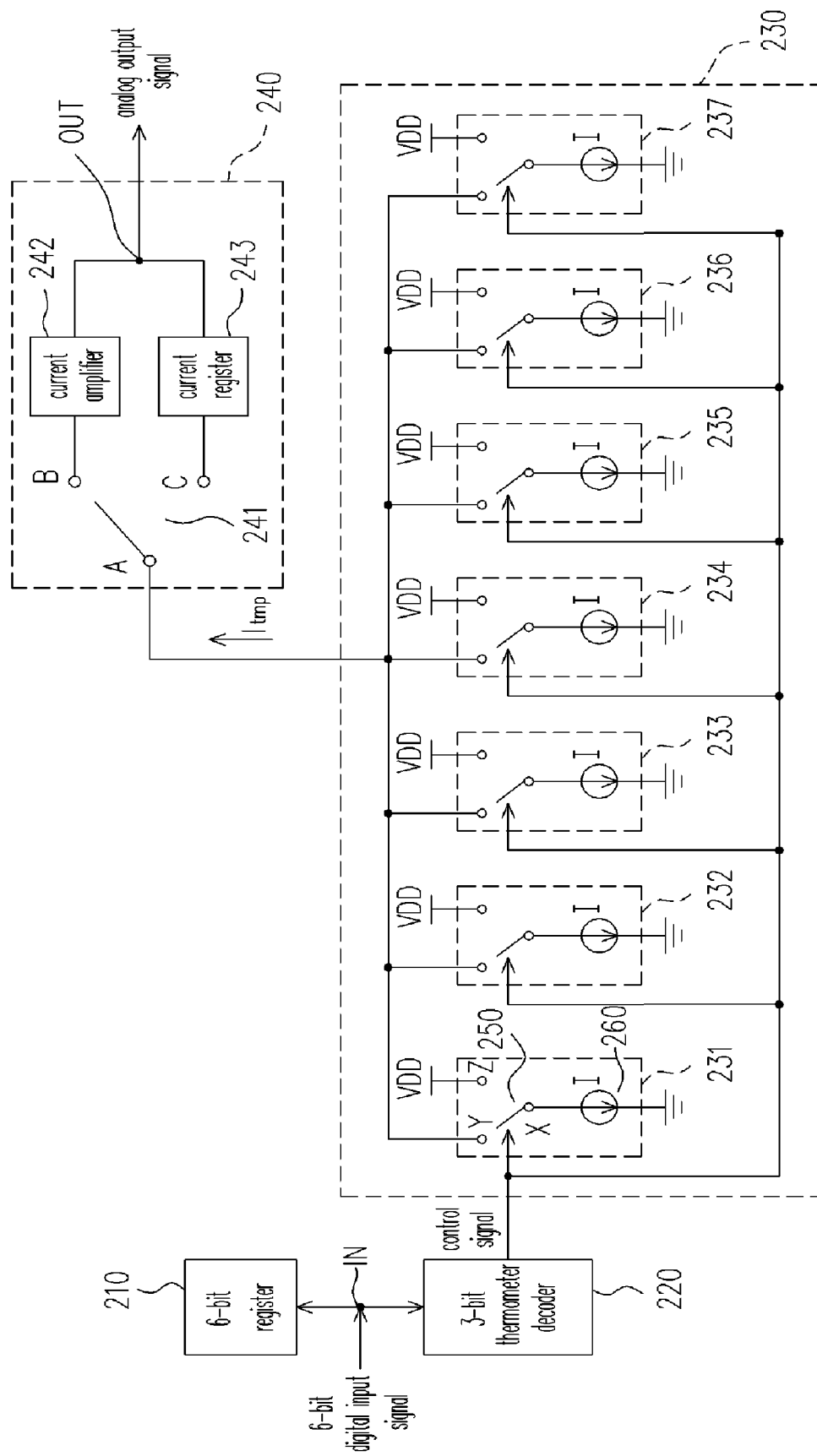
FIG. 2 is a block diagram of a digital-to-analog data converter according to another embodiment of the present invention.

FIG. 2 is a block diagram of a digital-to-analog data converter according to another embodiment of the present invention. In which, for example, a digital input signal having 6 bits is divided into the most significant bits having 3 bits and the least significant bits having 3 bits. FIG. 4 shows the input/output relationship of the thermometer decoder 220 in the digital-to-analog data converter of FIG. 2.

Referring to FIGS. 2 and 4, since the digital-to-analog data converter 200 receives the digital input signal having 6 bits, the register 210 can be a 6-bit digital data register. Also, since the least significant bits have 3 bits, the thermometer decoder 220 receives an input signal having 3 bits and decodes it into a control signal having $7(=2^3-1)$ bits. And each bit of the control signal controls a current supplier respectively for determining whether to provide current to the output unit 240 or not, therefore 7 current suppliers are desired, i.e. the converting unit 230 includes current suppliers 231~237.

In an embodiment, each of the current suppliers includes a switch and a current source, in which the switch determines whether conducting the output current of the current source to the output unit according to the control signal. Taking the current supplier 231 as an example, it includes a switch 250 and a current source 260. If the switch 250 receives a control signal of Logic 1, the switch 250 is "turned on", at this time the switch 250 is switched to the terminal Y (i.e. a path is formed between the terminals X and Y) to conduct the output current I of the current source 260 to the output unit 240. Contrarily, if the switch 250 receives a control signal of Logic 0, the switch 250 is "turned off", and at this time the switch 250 is switched to the terminal Z (i.e. a path is formed between the terminals X and Z) to provide other paths to the current source 260 such that the output current I thereof will not flow to the output unit 240. The single-pole dual throw (SPDT) switch such as the switch 250 provides another path for the current source 260 while the control signal is Logic 0. It shortens the settle time of the signal and reduces the effect upon the linearity of the signal when the switch throws.

For example, if the digital input signal is "010110", the most significant bits are "010" and the least significant bits are "110". During the first period, the thermometer decoder 220 receives the least significant bits "110" and will output the control signal "0111111" according to the input/output relationship of the thermometer decoder in FIG. 4. The seven bits of the control signal "0111111", from the left most significant bit (i.e. "0") to the right least significant bit (i.e. "1"), control the switches of the current suppliers 231~237 respectively, in which the switch 250 of the current supplier 231 is turned off, and the switches of the current suppliers 232~237 are turned on. Therefore, the current value of the first converting current ltmp,1 is 6I. The first converting current ltmp,1 is conducted to the current register 243 by the output switch 241, and is registered by the current register 243.

Then, during the second period, the thermometer decoder 220 receives the most significant bits "010" and will output a control signal "0000011" according to the input/output relationship of the thermometer decoder in FIG. 4. The seven bits of the control signal "0000011" control the switches of the current suppliers 231~237 respectively, in which the switches of the current suppliers 231~235 are turned off, and the switches of the current suppliers 236 and 237 are turned on. Therefore, the current value of the second converting current ltmp,2 is 2I. The second converting current ltmp,2 is conducted to the current amplifier 242 by the output switch 241, and is amplified by 8($=2^3$) times by the current amplifier 242 to be 16I. Finally, the first converting current ltmp,1 of value 6I output by the current register 243 and the second converting current ltmp,2 of value 16I output by the current amplifier 242 are combined at the output node OUT as an analog output signal, therefore the current value of the analog output signal corresponding to the digital input signal "010110" is 22I.

FIGS. 3A and 3B show the embodiments of the switch of the current supplier in the digital-to-analog data converter of FIG. 2. In which, the switch 250 of the current supplier 231 is taken as an example. Referring to FIG. 3A, one embodiment of the switch 250 is a three-terminal switch 301. The three-terminal switch 301 is switched to terminal Y if it receives one bit of a control signal CT which is Logic 1, and the three-terminal switch 301 is switched to terminal Z if it receives one bit of the control signal CT which is Logic 0. Referring to FIG. 3B, another embodiment of the switch 250 is composed of two two-terminal switches 311 and 312. If the two-terminal switch 311 receives one bit of the control signal CT which is Logic 1, the signals at both terminals thereof are conducted. At this time, the other two-terminal switch 312 must receive one bit of a control signal ~CT corresponding to the aforementioned bit of the control signal CT, and thus the signals at both terminals thereof are not conducted. Obviously, since the control signals CT and ~CT are complemented with each other, one of the two-terminal switches 311 and 312 conduct the signals while the other does not.

Figure 5:
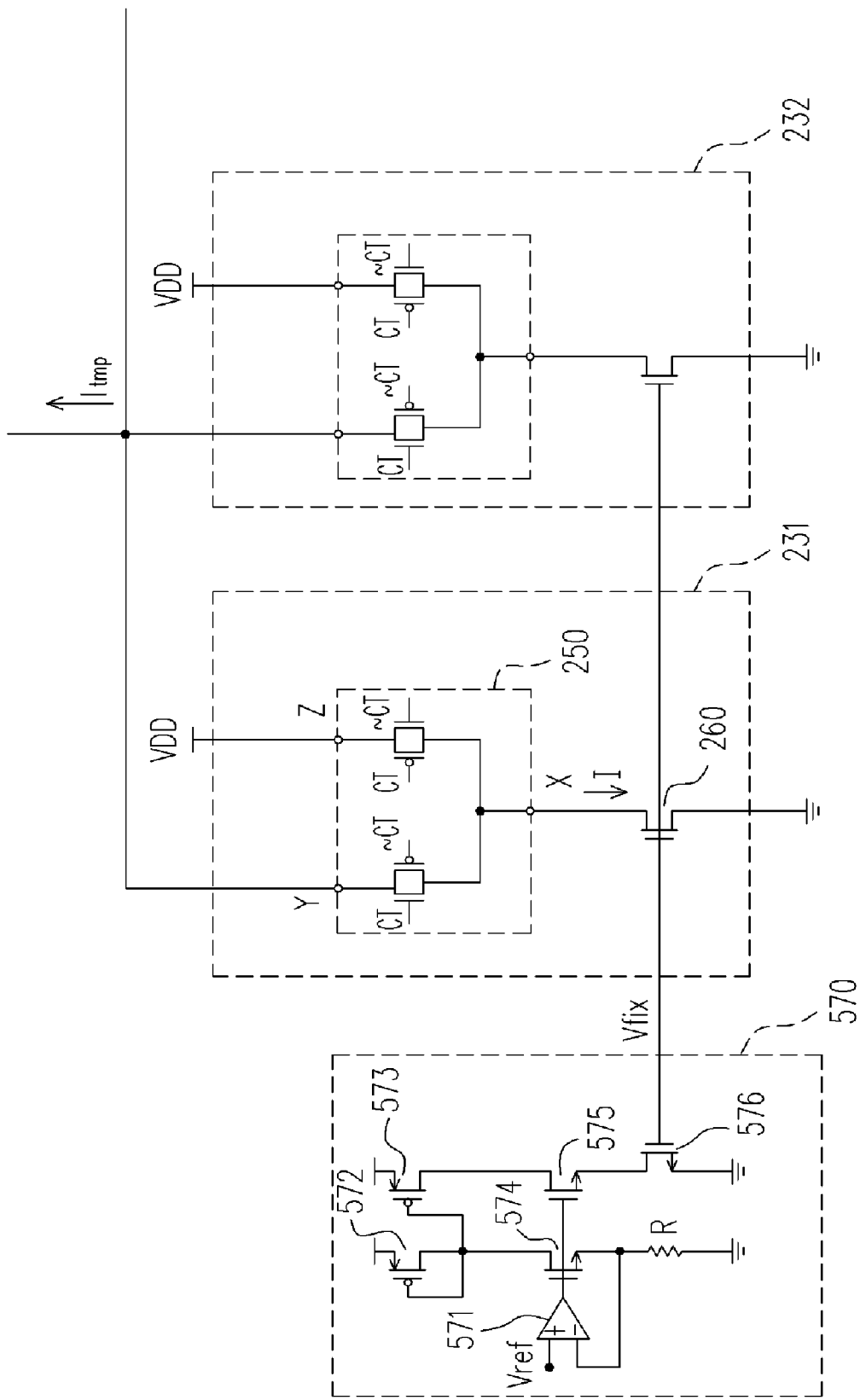
FIG. 5 shows a block diagram of the converting unit in the digital-to-analog data converter of FIG. 2.

FIG. 5 is a block diagram of the converting unit 230 in the digital-to-analog data converter of FIG. 2. Referring to FIG. 5, taking the current supplier 231 as an example, the switch 250 thereof employs the switch design as shown in FIG. 3B. Furthermore, the current source 260 is realized by a NMOS transistor in accompany with a reference current generator 570. The reference current generator 570 receives voltage Vref, and an operational amplifier 571 is used for feedback controlling in order to bias the transistor 574 with a more stable voltage. The transistors 572~575 form a current mirror, and the current mirror maps the current of the transistor 574 to the current of the transistor 575, then biases the current source 260 to generate constant current I through generating voltage Vfix by the transistor 576.

Figure 6:
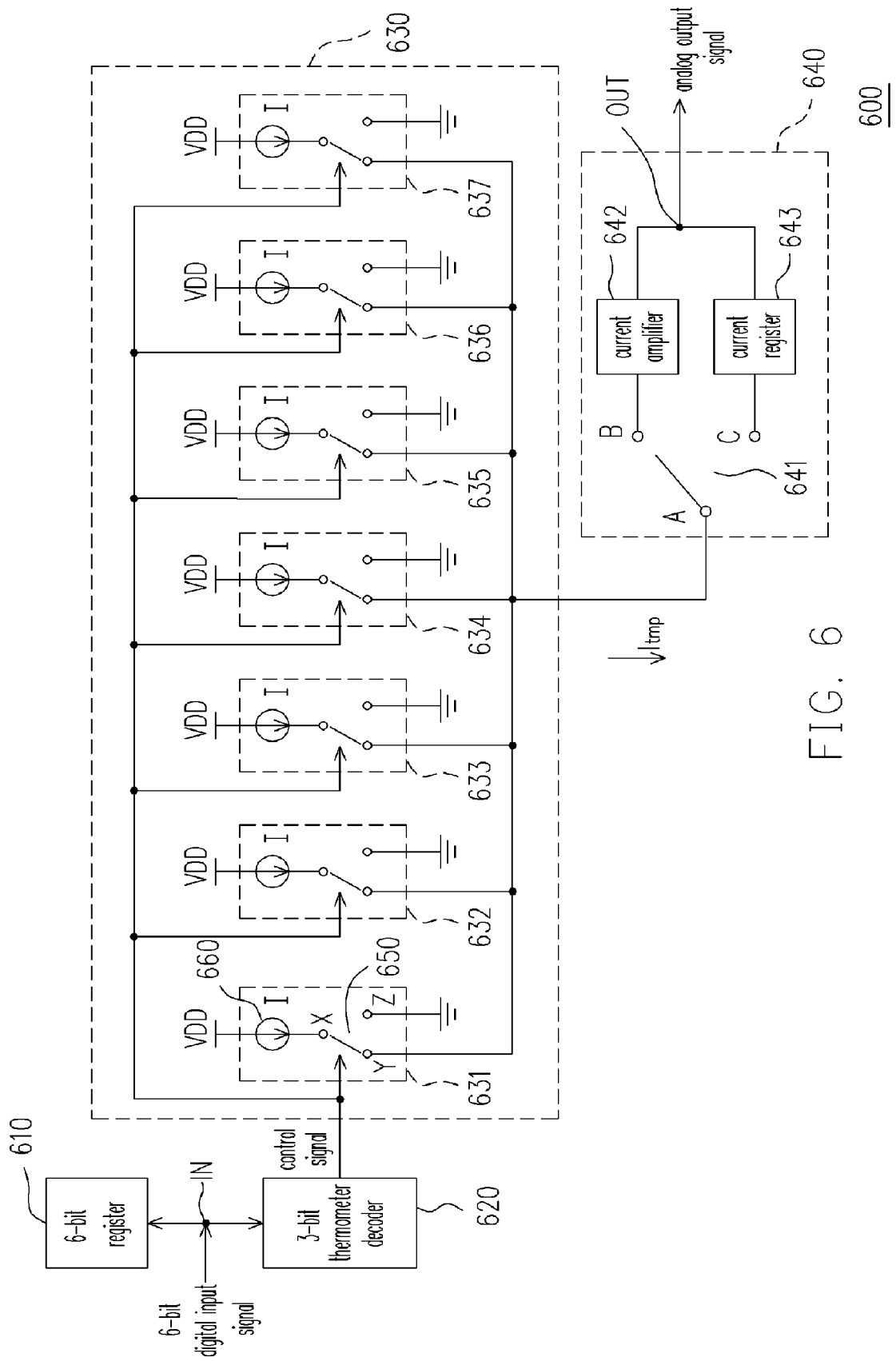
FIG. 6 is a block diagram of a digital-to-analog data converter according to yet another embodiment of the present invention.

FIG. 6 is a block diagram of a digital-to-analog data converter according to yet another embodiment of the present invention, which is similar to the digital-to-analog data converter 200 of FIG. 2. Referring to FIGS. 2 and 6, they are different in the design method of the converting unit. The design method is apparent to those skilled in the art, and will not be described herein. Although the aforementioned embodiments take the digital input signal having even bits as examples, they are also suitable for the digital input signal having odd bits with some modifications. For example, if the digital input signal is "1001010", then the most significant bits are "100" and the least significant bits are "1010". Accordingly, the processing steps are the same as the above-mentioned processing steps for the digital input signal having even bits.

In view of the above, the digital-to-analog data converter of the present invention employs the same converting unit to carry out the digital-to-analog data conversion of the least significant bits and the most significant bits of the digital input signal respectively, thus the architecture is simple. Moreover, the current needed by the above-mentioned converting unit during the transform of the most significant bits is based on the current needed by the above-mentioned converting unit during the transform of the least significant bits, thus the power consumption of the digital-to-analog data converter is extremely reduced.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A digital-to-analog data converter for converting a digital input signal into an analog output signal, the digital-to-analog data converter comprising:
   a register for receiving and registering the digital input signal, wherein the digital input signal comprises most significant bits and least significant bits;
   a decoder electrically connected to the register for decoding the least significant bits and taking the decoded least significant bits as a first control signal during a first period, and decoding the most significant bits and taking the decoded most significant bits as a second control signal during a second period;
   a converting unit electrically connected to the decoder for outputting a first converting current according to the first control signal during the first period, and outputting a second converting current according to the second control signal during the second period; and
   an output unit electrically connected to the converting unit for registering the first converting current during the first period, amplifying the second converting current and combining the amplified second converting current with the registered first converting current as the analog output signal during the second period.

2. The digital-to-analog data converter as claimed in claim 1, wherein when the most significant bits have M bits, the least significant bits have L bits and M+L is an even number, M equals to L, wherein M and L are positive integers.

3. The digital-to-analog data converter as claimed in claim 1, wherein when the most significant bits have M bits, the least significant bits have L bits and M+L is an odd number, M equals to L−1, wherein M and L are positive integers.

4. The digital-to-analog data converter as claimed in claim 1, wherein when the most significant bits have M bits and the least significant bits have L bits, the output unit amplifies the second converting current by $2^L$ times during the second period, wherein M and L are positive integers, and M is less than or equal to L.

5. The digital-to-analog data converter as claimed in claim 1, wherein the converting unit comprises a plurality of current suppliers, wherein each of the current suppliers determines whether to provide current to the output unit or not according to the first control signal during the first period, and determines whether to provide current to the output unit or not according to the second control signal during the second period.

6. The digital-to-analog data converter as claimed in claim 5, wherein each of the current suppliers comprises a switch and a current source, wherein the switch determines whether to conduct output current of the current source to the output unit according to the first control signal during the first period, and determines whether to conduct output current of the current source to the output unit according to the second control signal during the second period.

7. The digital-to-analog data converter as claimed in claim 6, wherein the output current of each of the current sources is substantially the same.

8. The digital-to-analog data converter as claimed in claim 7, wherein the decoder is a thermometer decoder.

9. The digital-to-analog data converter as claimed in claim 8, wherein when the most significant bits have M bits, the least significant bits have L bits and M equals to L, the thermometer decoder decodes the least significant bits having L bits, and outputs the first control signal having $2^L-1$ bits to control the switches of the current suppliers turn on or turn off respectively with each bit during the first period; and the thermometer decoder decodes the most significant bits having L bits, and outputs the second control signal having $2^L-1$ bits to control the switches of the current suppliers turn on or turn off respectively with each bit during the second period, wherein M and L are positive integers.

10. The digital-to-analog data converter as claimed in claim 8, wherein when the most significant bits have M bits, the least significant bits have L bits and M equals to L−1, the thermometer decoder decodes the least significant bits having L bits and outputs the first control signal having $2^L-1$ bits to control the switches of the current suppliers turn on or turn off respectively with each bit during the first period; and the thermometer decoder decodes the most significant bits and outputs the second control signal having $2^L-1$ bits to control the switches of the current suppliers turn on or turn off respectively with each bit during the second period, wherein M and L are positive integers.

11. The digital-to-analog data converter as claimed in claim 1, wherein the output unit comprises:
    a current register for registering input current of the current register;
    a current amplifier for amplifying input current of the current amplifier;
    an output switch for conducting the first converting current to the current register to register the first converting current during the first period, and conducting the second converting current to the current amplifier to amplify the second converting current during the second period; and
    an output node electrically connected to the current register and the current amplifier, for outputting the analog output signal, wherein the analog output signal is a combination of output current of the current register and output current of the current amplifier.

12. A method for digital-to-analog data conversion for converting a digital input signal to an analog output signal, the method for digital-to-analog data conversion comprising:
    receiving the digital input signal, wherein the digital input signal comprises most significant bits and least significant bits;
    decoding the least significant bits, taking the decoded least significant bits as a first control signal, and converting the first control signal to a first converting current during a first period;
    decoding the most significant bits, taking the decoded most significant bits as a second control signal, converting the second control signal to a second converting current, and amplifying the second converting current during a second period; and
    combining the first converting current and the amplified second converting current as the analog output signal.

13. The method for digital-to-analog data conversion as claimed in claim 12, wherein when the most significant bits has M bits, the least significant bits has L bits and M+L is an even number, M equals to L, wherein M and L are positive integers.

14. The method for digital-to-analog data conversion as claimed in claim 12, wherein when the most significant bits has M bits, the least significant bits has L bits and M+L is an odd number, M equals to L−1, wherein M and L are positive integers.

15. The method for digital-to-analog data conversion as claimed in claim 12, wherein when the most significant bits has M bits and the least significant bits has L bits, the second converting current is amplified by $2^L$ times during the second period, wherein M and L are positive integers, and M is less than or equal to L.

16. The method for digital-to-analog data conversion as claimed in claim 12, further comprising registering the digital input signal.

17. The method for digital-to-analog data conversion as claimed in claim 12, wherein decoding the least significant bits during the first period and decoding the most significant bits during the second period are implemented by of thermometer decoding.

* * * * *